United States Patent
Han (10) Patent No.: US 10,681,841 B2
(45) Date of Patent: Jun. 9, 2020

(54) WATER-COOLING HEAT DISSIPATION DEVICE SUITABLE FOR COMPUTER

(71) Applicant: Tai-Sheng Han, New Taipei (TW)

(72) Inventor: Tai-Sheng Han, New Taipei (TW)

(73) Assignee: EVGA CORPORATION, New Taipei (TW)

( * ) Notice: Subject to any disclaimer, the term of this patent is extended or adjusted under 35 U.S.C. 154(b) by 64 days.

(21) Appl. No.: 16/058,920

(22) Filed: Aug. 8, 2018

(65) Prior Publication Data

US 2020/0053911 A1 Feb. 13, 2020

(51) Int. Cl.
*H05K 7/20* (2006.01)

(52) U.S. Cl.
CPC ..... *H05K 7/20272* (2013.01); *H05K 7/20263* (2013.01); *H05K 7/20436* (2013.01)

(58) Field of Classification Search
CPC ....................... H01L 23/473; F28D 2021/0028
USPC ...... 165/80.4, 133, 185; 361/679.53, 679.55, 361/679.6, 699, 701–703; 417/410.1, 417/413.3, 423.7, 423.3, 423.14
See application file for complete search history.

(56) References Cited

U.S. PATENT DOCUMENTS

| | | | | |
|---|---|---|---|---|
| 7,215,546 B2 * | 5/2007 | Hata | .................... | F04D 29/588 165/104.33 |
| 7,255,154 B2 * | 8/2007 | Koga | .................... | F04D 29/588 165/104.33 |
| 7,325,591 B2 * | 2/2008 | Duan | .................... | H01L 23/473 165/104.33 |
| 7,544,049 B2 * | 6/2009 | Koga | .................... | H01L 23/473 361/699 |
| 8,051,898 B2 * | 11/2011 | Chiang | ................. | H01L 23/473 165/104.28 |
| 2003/0072656 A1 * | 4/2003 | Niwatsukino | ........... | F04D 5/002 417/354 |
| 2004/0052049 A1 * | 3/2004 | Wu | ..................... | F28D 15/0266 361/699 |
| 2004/0105232 A1 * | 6/2004 | Ito | .......................... | F04D 5/002 361/679.53 |
| 2005/0147512 A1 * | 7/2005 | Chen | .................. | F16C 32/0459 417/423.12 |
| 2005/0264996 A1 * | 12/2005 | Tomioka | ................ | F04B 35/04 361/695 |
| 2006/0191667 A1 * | 8/2006 | Chen | ................. | H05K 7/20272 165/80.4 |
| 2006/0193115 A1 * | 8/2006 | Chen | ..................... | F04D 13/12 361/699 |
| 2007/0029069 A1 * | 2/2007 | Duan | ....................... | G06F 1/20 165/80.4 |

(Continued)

*Primary Examiner* — Jianying C Atkisson
*Assistant Examiner* — Jose O Class-Quinones
(74) *Attorney, Agent, or Firm* — Che-Yang Chen; Law Offfice of Michael Chen (57) ABSTRACT

A water-cooling heat dissipation device suitable for computer includes a pump housing, an upper cover, a motor module and a heat exchange member. The pump housing forms a pump chamber. A side of the upper cover has at least one positioning portion. A side of the motor module has at least one assembly portion that is correspondingly disposed with respect to the positioning portion. A stator set is received in the interior of the motor module. The heat exchange member is correspondingly combined with the pump housing. The heat exchange member forms a heat exchange chamber, and the heat exchange chamber is in communication with the pump chamber.

8 Claims, 7 Drawing Sheets

(56) References Cited

U.S. PATENT DOCUMENTS

| | | | | |
|---|---|---|---|---|
| 2007/0103869 | A1* | 5/2007 | Liu | H01L 23/473 |
| | | | | 361/699 |
| 2008/0104992 | A1* | 5/2008 | Lai | H01L 23/473 |
| | | | | 62/435 |
| 2009/0159244 | A1* | 6/2009 | Mounioloux | F04D 29/586 |
| | | | | 165/104.33 |
| 2014/0020863 | A1* | 1/2014 | Hawwa | F28F 3/02 |
| | | | | 165/67 |
| 2014/0131007 | A1* | 5/2014 | Lyon | F28F 9/007 |
| | | | | 165/67 |
| 2017/0339802 | A1* | 11/2017 | Pan | F28D 15/00 |
| 2017/0367217 | A1* | 12/2017 | Xiao | G06F 1/203 |

* cited by examiner

WATER-COOLING HEAT DISSIPATION DEVICE SUITABLE FOR COMPUTER

BACKGROUND OF THE INVENTION

1. Technical Field

The present utility model relates to a water-cooling heat dissipation device suitable for computer, and in particular, to a water-cooling heat dissipation device suitable for computer that a motor module of which is allowed to be arbitrarily replaced according to requirements and also the replacement of motor module can be easily completed.

2. Background Art

In a conventional water-cooling apparatus, heat absorbed from a heating element (a processor or a graphics processor) is subject to heat exchange by means of a cooling liquid in the water-cooling apparatus. Then, the cooling liquid is circulated by using a pump of the water-cooling apparatus. Besides, the water-cooling apparatus is connected to a radiator through a plurality of pipes, so that the cooling liquid can exchange heat and radiate cyclically between the radiator and the water-cooling apparatus, thus rapidly cooling the heating element.

However, a motor module (the motor module has a stator set that includes a plurality of silicon steel sheets wound with a plurality of coils) of the conventional water-cooling apparatus is disposed in a pump housing. If a motor module having a different power or function is used under a different circumstance by a user according to requirement, the user should replace the whole water-cooling apparatus with a water-cooling apparatus that is necessary to be used. This easily causes inconvenience in usage. Moreover, if the motor module disposed in the pump housing is damaged, it is impossible to replace only the motor module, and the cost is thus increased since replacement of the whole water-cooling apparatus is required.

Therefore, how to solve the problem and defect of the conventional water-cooling apparatus is an issue that the designer of the present utility model and related vendors in the industry should study and address urgently.

SUMMARY OF THE UTILITY MODEL

In order to effectively solve the foregoing problem, a primary objective of the present utility model is to provide a water-cooling heat dissipation device suitable for computer that a motor module is allowed to be arbitrarily replaced according to requirements.

A secondary objective of the present utility model is to provide a water-cooling heat dissipation device suitable for computer that replacement of motor module can be easily completed.

In order to achieve the foregoing objectives, the present utility model provides a water-cooling heat dissipation device suitable for computer, which includes a pump housing, an upper cover, a motor module, and a heat exchange member. The pump housing forms a pump chamber. The upper cover has a first side and a second side. The first side has at least one positioning portion. The second side correspondingly covers the pump chamber. An axis is disposed on the second side. An impeller is received in the pump chamber and pivotally disposed with respect to the axis. A side of the motor module has at least one assembly portion. The assembly portion is correspondingly disposed with respect to the positioning portion. A stator set is received in the interior of the motor module. The heat exchange member is correspondingly combined with the pump housing. The heat exchange member forms a heat exchange chamber, and the heat exchange chamber is in communication with the pump chamber.

Through the design of the structure in the present utility model, the stator set is disposed in the motor module, and the assembly portion on a side of the motor module is assembled with the positioning portion on the first side of the upper cover. If a motor module having a different power or function should be used under a different circumstance by a user, it is only necessary to separate the upper cover from the motor module, and then the mot or module can be easily replaced. Accordingly, an effect capable of changing different motor modules arbitrarily is thus achieved.

In addition, if the stator set in the water-cooling heat dissipation device suitable for computer is damaged, the upper cover can also be separated from the motor module, so that the damaged stator set can be replaced. Hence, the effect capable of conveniently replacing the motor module is thus achieved. Furthermore, the defects in the prior art such as that motor module of conventional water-cooling apparatus cannot be detached easily and the whole stator set should be replaced when the stator set is damaged, are also be eliminated.

DETAILED DESCRIPTION

The foregoing objective of the present utility model as well as structural and functional features thereof will be described with reference to the preferred embodiments shown in the accompanying drawings.

Figure 1:
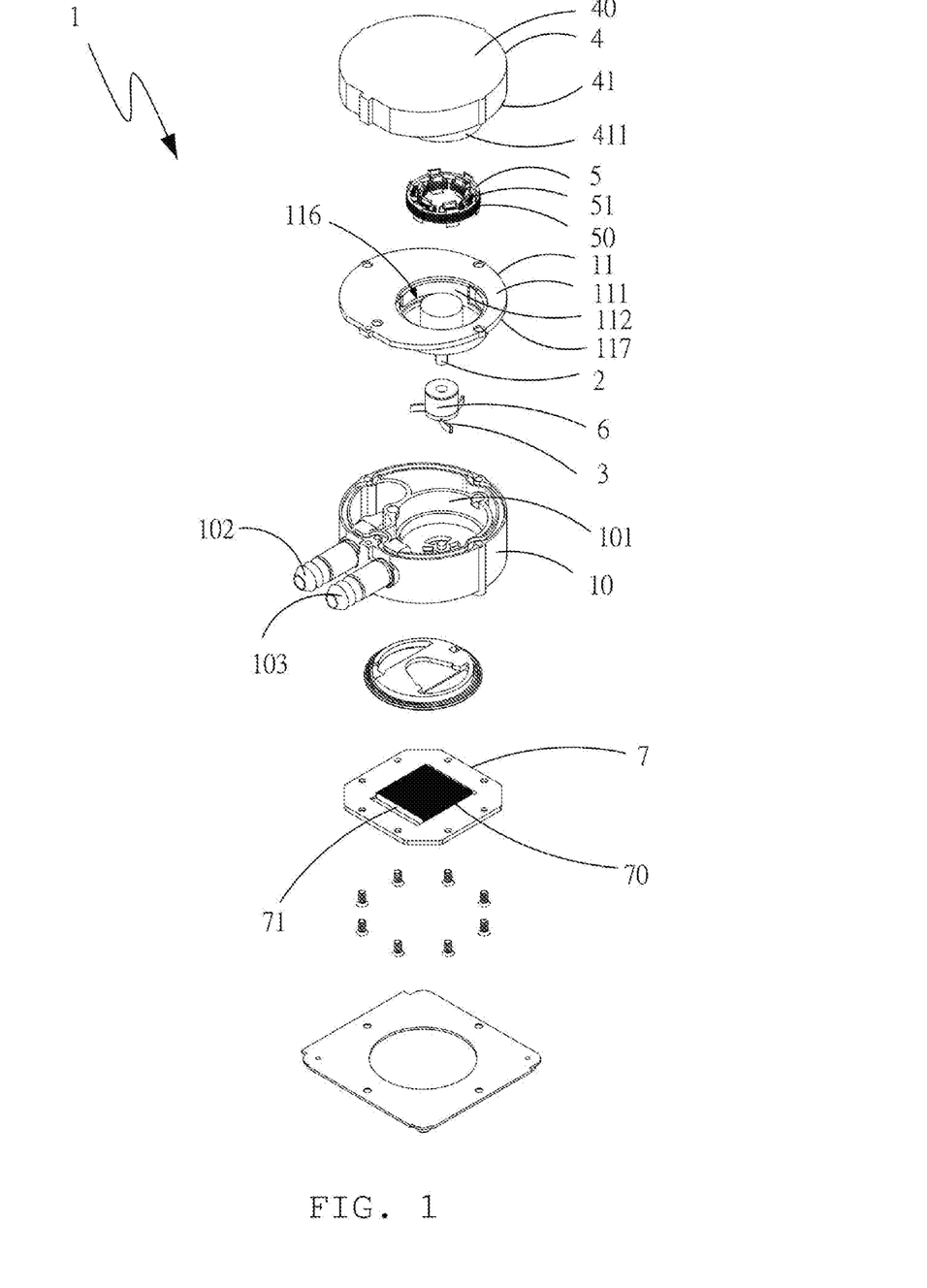
FIG. 1 is a three-dimensional exploded view of a first embodiment of a water-cooling heat dissipation device suitable for computer according to the present utility model.
Figure 2:
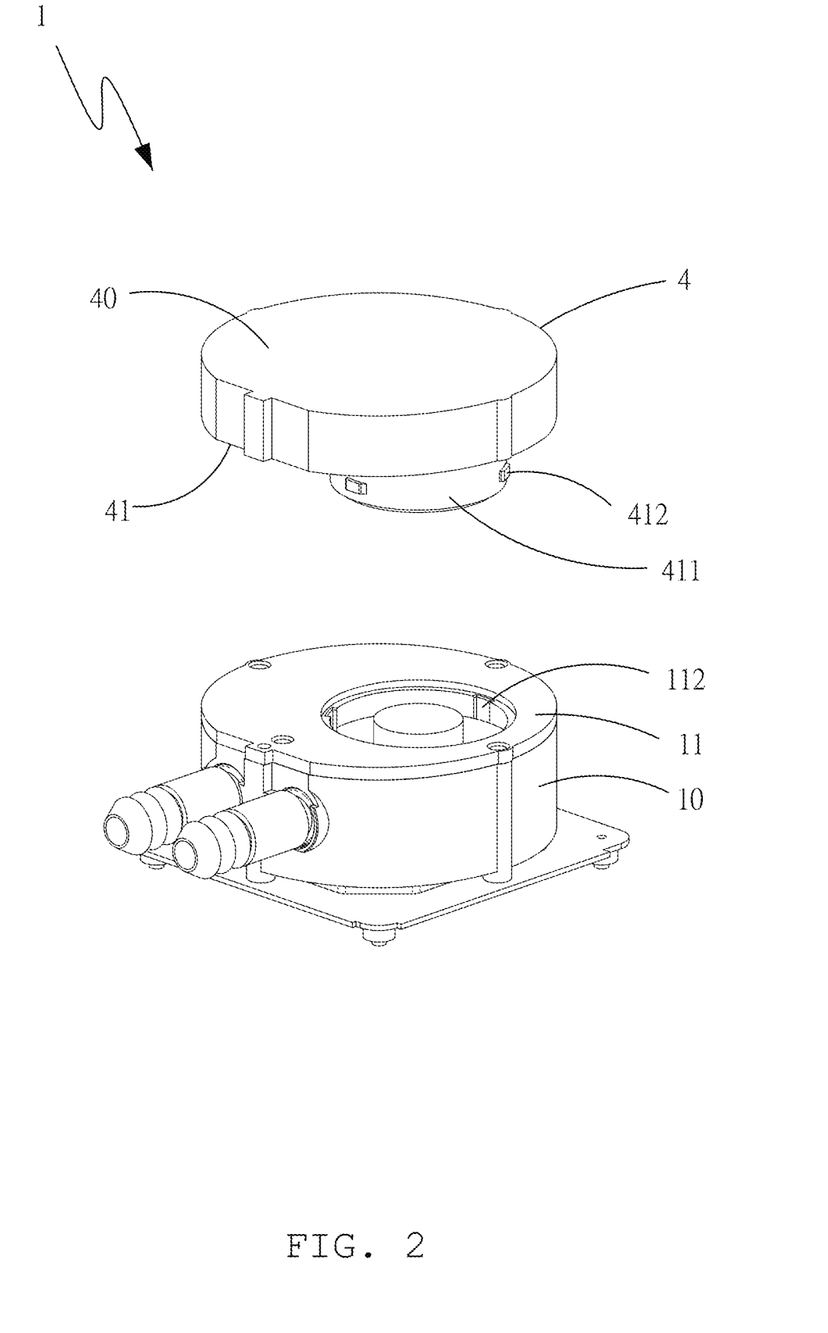
FIG. 2 is a three-dimensional view of the first embodiment of the water-cooling heat dissipation device suitable for computer according to the present utility model.
Figure 3:
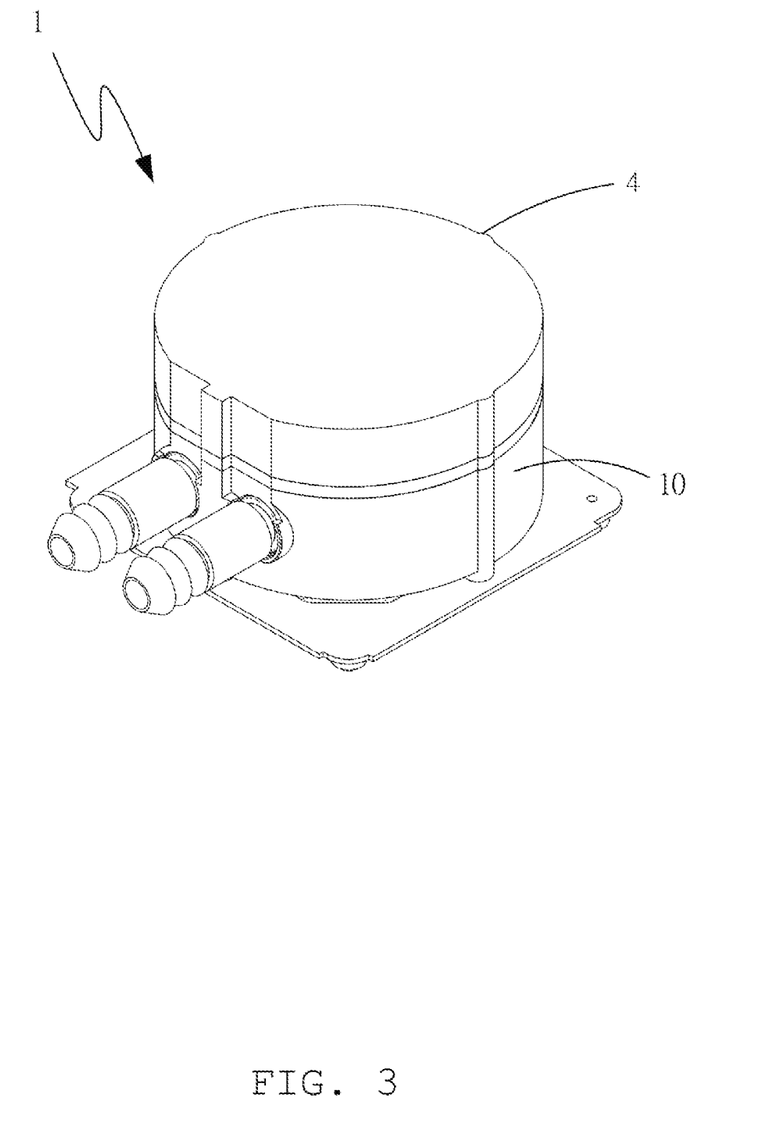
FIG. 3 is a three-dimensional assembly view of the first embodiment of the water-cooling heat dissipation device suitable for computer according to the present utility model.

Referring to FIG. 1, FIG. 2, and FIG. 3, FIG. 1, FIG. 2, and FIG. 3 are a three-dimensional exploded view, a three-dimensional view, and a three-dimensional assembly view of a first embodiment of a water-cooling heat dissipation device suitable for computer according to the present utility model. As shown in the figures, a water-cooling heat dissipation device suitable for computer 1 includes a pump housing 10, an upper cover 11, a motor module 4, and a heat exchange member 7. The pump housing 10 has an inlet 102, an outlet 103, and a pump chamber 101. The inlet 102 is in communication with the pump chamber 101 and the outlet 103. The upper cover 11 has a first side 111 and a second side 117. The first side 111 is concaved to forma receiving portion 116, and at least one positioning portion 112 is provided in the receiving portion 116. The second side 117 correspondingly covers the pump chamber 101. An axis 2 is disposed on the second side 117. An impeller 3 is correspondingly received in the pump chamber 101 and is pivotally disposed with respect to the axis 2. It should be particularly noted that the axis 2 is fixed on the second side 117 of the upper cover 11 in a close fitting manner, but the fixing is not limited to the close fitting manner. It should be noted that in actual implementation, the axis 2 can also be integrally formed with the upper cover 11.

In this embodiment, the motor module 4 protrudes downward to form a convex column 411 that is correspondingly received in the receiving portion 116. A stator set 5 is disposed in the convex column 411. An assembly portion 412 is provided on the periphery of the convex column 411. The assembly portion 412 is correspondingly disposed with respect to the positioning portion 112.

The stator set 5 is formed by a plurality of silicon steel sheets 50 stacked together, and the silicon steel sheets 50 are wound with a plurality of coils 51. A magnetic element 6 is disposed around the periphery of the impeller 3. Mutual induction and excitation occur between the magnetic element 6 and the coils 51, so that the impeller 3 is driven to rotate.

The heat exchange member 7 is correspondingly combined with the pump housing 10. The heat exchange member 7 has a plurality of heat sink fins 70 arranged at intervals or in a staggered manner to form a heat exchange chamber 71. The heat exchange chamber 71 is in communication with the pump chamber 101, the outlet 103 and the inlet 102, and allows an operating liquid (not shown in the figure) to pass through.

Through the design of the structure in the present utility model, the stator set 5 is disposed in the motor module 4, and the assembly portion 412 on a side of the motor module 4 is assembled with the positioning portion 112 on the first side 111 of the upper cover 11. If a mot or module 4 having a different power or function should be used under a different circumstance by a user, it is only necessary to separate the upper cover 11 from the motor module 4, and then the motor module 4 can be easily replaced with the motor module 4 having the function or power required by the user, achieving the effect of changing different motor modules 4 arbitrarily. It should be particularly noted that according to combination structure patterns between the positioning portion 112 and the assembly portion 412, the upper cover 11 and the motor module 4 can be separated from each other in various manners. It should be noted that all the separation manners are included in the protection scope of the present utility model.

In addition, if the stator set 5 in the water-cooling heat dissipation device suitable for computer 1 is damaged, the effect of conveniently replacing the motor module 4 can also be achieved through the foregoing technical measure, hence solving the defect that the motor module in the conventional water-cooling apparatus cannot be detached easily and the whole stator set should be replaced when the stator set is damaged.

Figure 4:
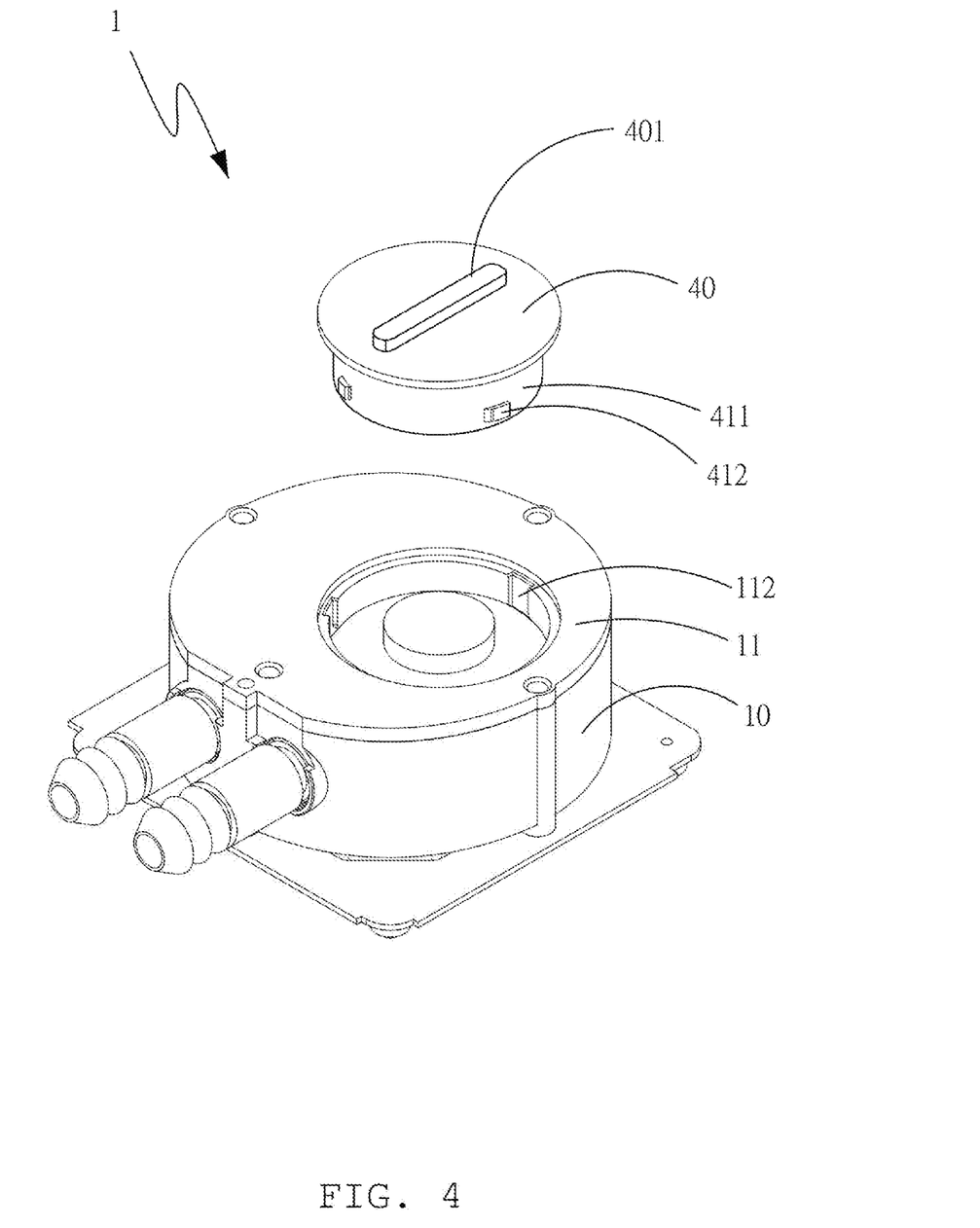
FIG. 4 is a three-dimensional view of a second embodiment of a water-cooling heat dissipation device suitable for computer according to the present utility model.
Figure 5:
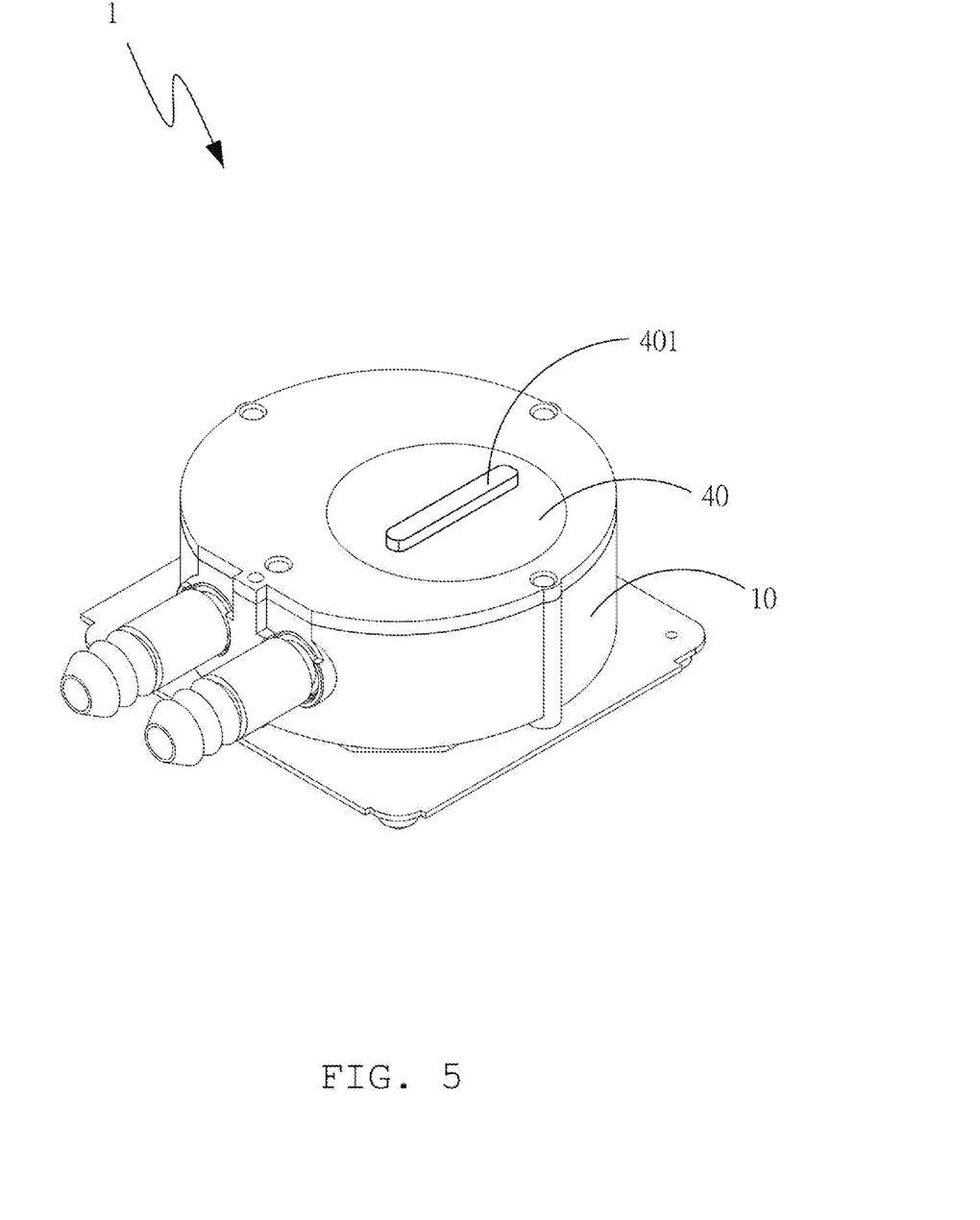
FIG. 5 is a three-dimensional assembly view of the second embodiment of the water-cooling heat dissipation device suitable for computer according to the present utility model.

Referring to FIG. 4 and FIG. 5, FIG. 4 and FIG. 5 are a three-dimensional view and a three-dimensional assembly view of a second embodiment of a water-cooling heat dissipation device suitable for computer according to the present utility model. This water-cooling heat dissipation device suitable for computer mainly differs from the foregoing water-cooling radiator in that the motor module 4 further has an upper side 40 and a lower side 41. The upper side 40 is correspondingly flush with the first side 111 of the upper cover 11. The lower side 41 protrudes to form the convex column 411. In other words, the size of the motor module 4 in this embodiment is the same as the size of the space of the receiving portion 116, so that the motor module 4 can be completely disposed in the receiving portion 116. In addition, the upper side 40 of the motor module 4 forms at least one raised portion 401. In this embodiment, the raised portion 401 is a raised strip. It should be noted that in actual implementation, the raised portion 401 can also be a raised body or a raised point. Through the structure pattern of this embodiment, if a motor module 4 having a different power or function should be used under a different circumstance by a user, it is only necessary to separate the motor module 4 from the upper cover 11, and then the motor module 4 can be easily replaced with the motor module 4 having the function or power required by the user, achieving the effect of changing different motor modules 4 arbitrarily.

Figure 6:
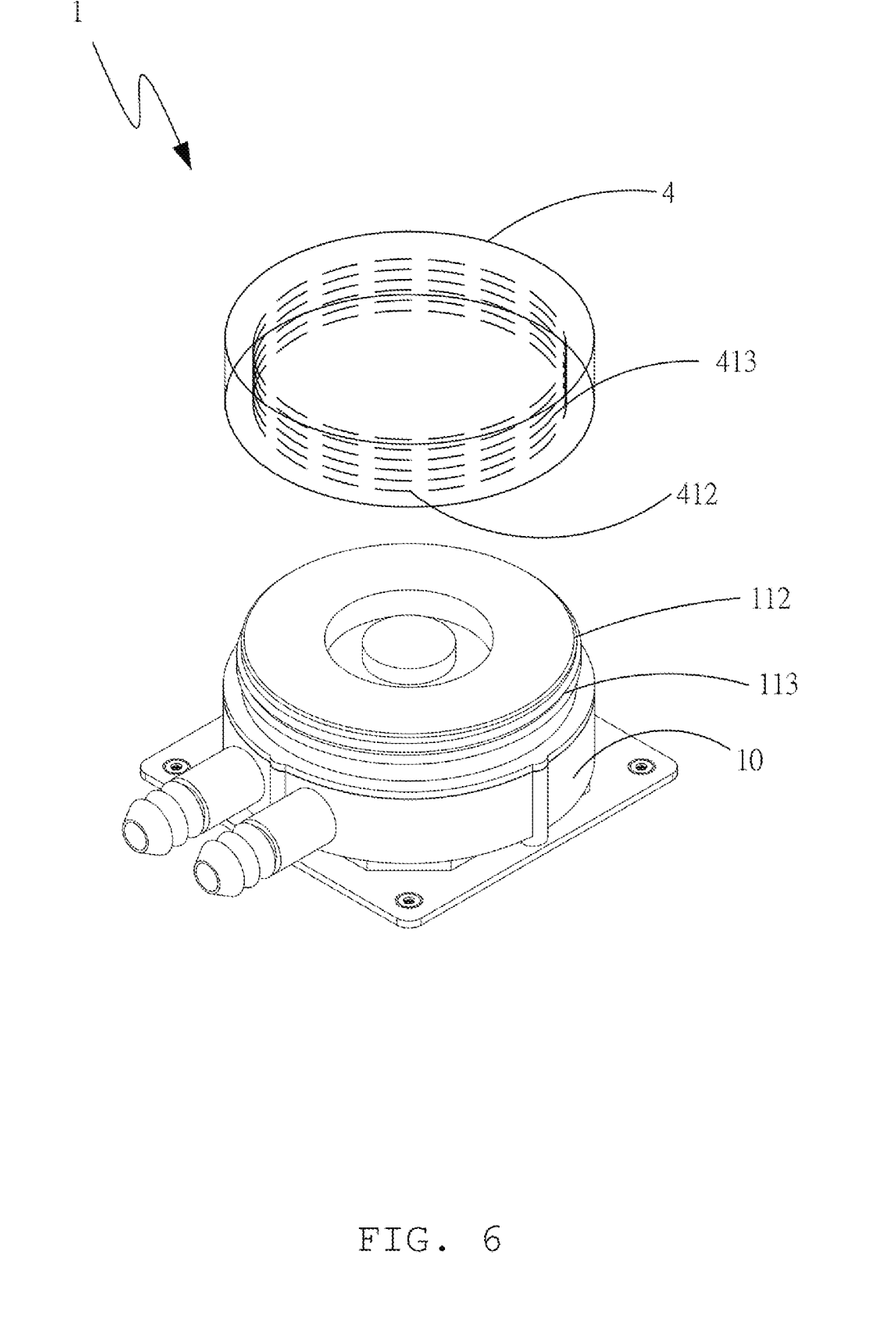
FIG. 6 is a three-dimensional view of a third embodiment of a water-cooling heat dissipation device suitable for computer according to the present utility model.

Referring to FIG. 6, FIG. 6 is a three-dimensional diagram of a third embodiment of a water-cooling heat dissipation device suitable for computer according to the present utility model. This water-cooling heat dissipation device suitable for computer mainly differs from the foregoing water-cooling radiator in that the positioning portion 112 is formed at the periphery of the first side 111 of the upper cover 11. The positioning portion 112 has a plurality of external threads 113. The assembly portion 412 is disposed in the motor module 4. The assembly portion 412 has a plurality of internal threads 413 correspondingly screwed to the external threads 113. Therefore, the motor module 4 and the upper cover 11 can be rotated to screw tight or separate from each other through a screw connection between the external threads 113 and the internal threads 413. As such, the foregoing effect can also be achieved.

Figure 7:
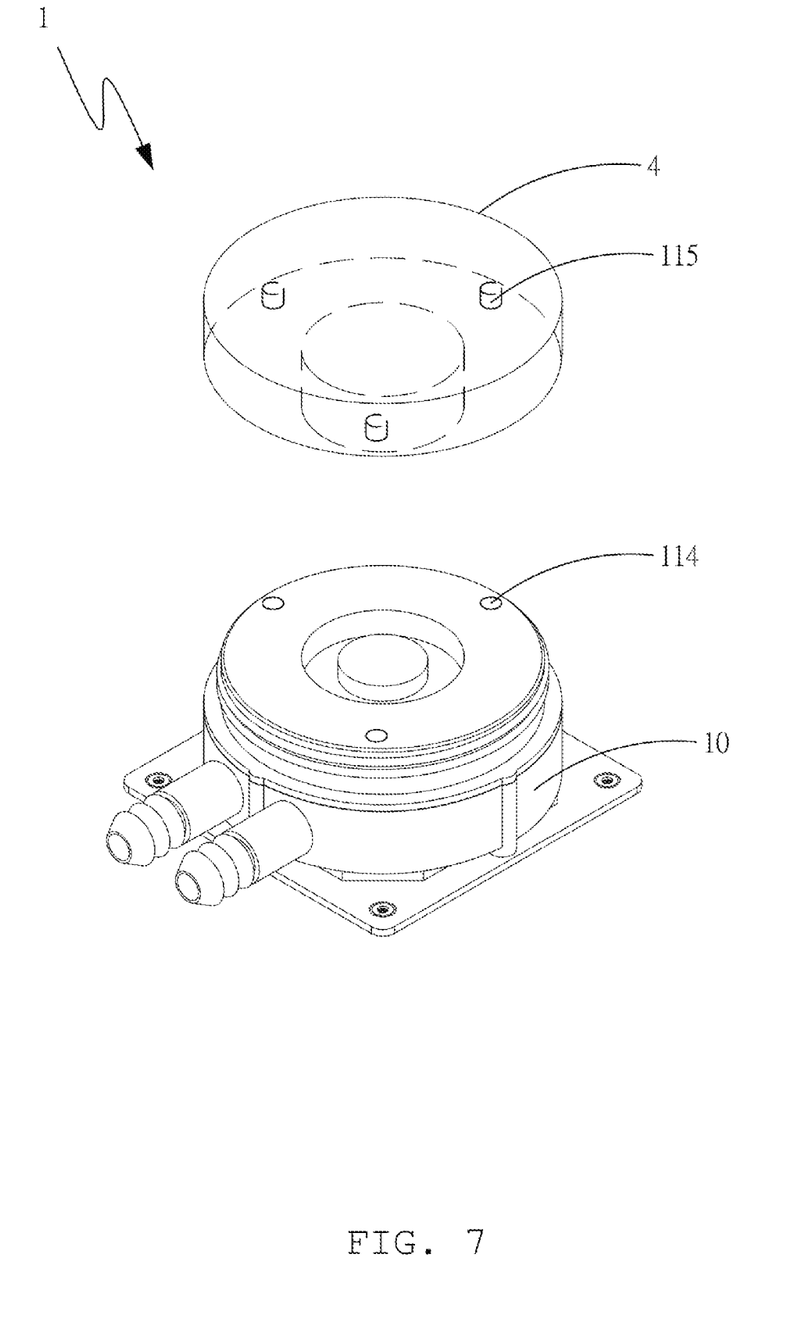
FIG. 7 is a three-dimensional view of a fourth embodiment of a water-cooling heat dissipation device suitable for computer according to the present utility model.

Finally, referring to FIG. 7, FIG. 7 is a three-dimensional view of a fourth embodiment of a water-cooling heat dissipation device suitable for computer according to the present utility model. This water-cooling heat dissipation device suitable for computer mainly differs from the foregoing water-cooling radiator in that the positioning portion 112 has at least one first magnetic member 114, the assembly portion 412 has at least one second magnetic member 115, and the second magnetic member 115 and the first magnetic member 114 attract each other. Therefore, the motor module 4 and the upper cover 11 can be fixed through mutual attraction of the first and second magnetic members 114 and 115. If the mot or module 4 should be replaced, the motor module 4 can be directly detached from the upper cover 11. As such, the foregoing effect can also be achieved.

According to the description above, the present utility mode has the following advantages compared with the prior art:

1. The motor module can be replaced arbitrarily according to requirements.

2. Convenient replacement of the motor module is achieved.

The present utility model has been described in detail above. Described above is merely a preferred embodiment of the present utility model, and cannot limit the implementation scope of the present utility model. In other words, all equivalent changes, modifications and the like made in accordance with the application scope of the present utility model should still belong to the patent scope of the present utility model.

What is claimed is:

1. A water-cooling heat dissipation device suitable for computer, comprising:
   a pump housing, forming a pump chamber;
   an upper cover having a first side and a second side, the first side having at least one positioning portion, the second side correspondingly covering the pump chamber, an axis being disposed at the second side, an impeller being disposed in the pump chamber and pivotally disposed with respect to the axis, and a magnetic element being disposed around the periphery of the impeller;
   a motor module having at least one assembly portion on one side, the assembly portion being correspondingly disposed with respect to the positioning portion, a stator set being received in the interior of the motor module, and the stator set having a plurality of silicon steel sheets wound with a plurality of coils; and
   a heat exchange member correspondingly combined with the pump housing, the heat exchange member forming a heat exchange chamber, and the heat exchange chamber being in communication with the pump chamber; wherein
   the positioning portion is formed on an inner wall of a receiving portion, the motor module further protrudes downward to form a convex column that correspondingly receives the stator set, and the periphery of the convex column is provided with the assembly portion that is correspondingly disposed with respect to the positioning portion.

2. The water-cooling heat dissipation device suitable for computer according to claim 1, wherein the first side is further concaved to form the receiving portion that correspondingly receives the convex column.

3. The water-cooling heat dissipation device suitable for computer according to claim 2, wherein the motor module further has an upper side and a lower side, the upper side is correspondingly flush with the first side of the upper cover, the upper side forms at least one raised portion, and the lower side protrudes to form the convex column.

4. The water-cooling heat dissipation device suitable for computer according to claim 1, wherein the positioning portion is formed on the periphery of the first side, the positioning portion has a plurality of external threads, the assembly portion is formed in the interior of the motor module, the assembly portion has a plurality of internal threads, and the internal threads are correspondingly screwed to the external threads.

5. The water-cooling heat dissipation device suitable for computer according to claim 1, wherein the positioning portion has at least one first magnetic member, the assembly portion has at least one second magnetic member, and the second magnetic member and the first magnetic member attract each other.

6. The water-cooling heat dissipation device suitable for computer according to claim 1, wherein the pump housing further has an inlet and an outlet, the inlet is in communication with the pump chamber, the heat exchange chamber and the outlet.

7. The water-cooling heat dissipation device suitable for computer according to claim 1, wherein mutual induction and excitation occur between the magnetic element and the coils, so that the impeller is driven to rotate.

8. The water-cooling heat dissipation device suitable for computer according to claim 1, wherein the heat exchange member has a plurality of heat sink fins arranged at intervals or in a staggered manner, and the heat sink fins are in contact with an operating liquid in the heat exchange chamber.

* * * * *